US011205470B2

(12) United States Patent
Park et al.

(10) Patent No.: US 11,205,470 B2
(45) Date of Patent: Dec. 21, 2021

(54) APPARATUSES AND METHODS FOR PROVIDING MAIN WORD LINE SIGNAL WITH DYNAMIC WELL

(71) Applicant: MICRON TECHNOLOGY, INC., Boise, ID (US)

(72) Inventors: Sang-Kyun Park, Boise, ID (US); Tae H. Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1 day.

(21) Appl. No.: 16/853,417

(22) Filed: Apr. 20, 2020

(65) Prior Publication Data

US 2021/0327490 A1 Oct. 21, 2021

(51) Int. Cl.
| | |
|---|---|
| G11C 11/408 | (2006.01) |
| G11C 5/06 | (2006.01) |
| G11C 11/56 | (2006.01) |
| G11C 11/4074 | (2006.01) |

(52) U.S. Cl.
CPC ............ *G11C 11/4085* (2013.01); *G11C 5/06* (2013.01); *G11C 11/4074* (2013.01); *G11C 11/5642* (2013.01)

(58) Field of Classification Search
CPC .................................................. G11C 11/4085
See application file for complete search history.

(56) References Cited

U.S. PATENT DOCUMENTS

| | | | |
|---|---|---|---|
| 5,524,095 A * | 6/1996 | Someya | G11C 8/08 |
| | | | 365/189.09 |
| 5,587,960 A | 12/1996 | Ferris | |
| 5,886,942 A * | 3/1999 | Akita | G11C 11/4085 |
| | | | 365/230.06 |
| 6,028,813 A | 2/2000 | Choi | |
| 6,178,122 B1 | 1/2001 | Tomishima et al. | |
| 6,337,832 B1 | 1/2002 | Ooishi et al. | |
| 6,421,295 B1 | 7/2002 | Mao et al. | |

(Continued)

FOREIGN PATENT DOCUMENTS

| | | |
|---|---|---|
| KR | 20140136766 A | 12/2014 |
| WO | 2020210113 A1 | 10/2020 |

OTHER PUBLICATIONS

U.S. Appl. No. 17/038,604 titled "Apparatuses and Methods for Controlling Word Line Discharge" filed Sep. 30, 2020; pp. all.

(Continued)

*Primary Examiner* — Douglas King
(74) *Attorney, Agent, or Firm* — Dorsey & Whitney LLP (57) ABSTRACT

A main word driver may be coupled to a subword driver to drive a main word line to select the subword driver. The main word driver may include a first transistor having a body and source/drain both coupled to a well. The main word driver may include a well control circuit configured to bias the well. In some examples, the well control circuit may provide a first low potential to the well followed by a second low potential lower than the first potential responsive to a precharge command. The main word driver may include a second transistor coupled to the well control circuit to receive the first and second low potentials and couple the first and second low potentials to the main word line. The body of the second transistor may be coupled to the well. Additional transistors in the main word driver may also be coupled to the well.

16 Claims, 9 Drawing Sheets

(56) References Cited

U.S. PATENT DOCUMENTS

| | | |
|---|---|---|
| 6,507,532 B1 | 1/2003 | Fujino et al. |
| 6,628,564 B1 | 9/2003 | Takita et al. |
| 7,251,160 B2 | 7/2007 | Li et al. |
| 7,492,640 B2 | 2/2009 | Mokhlesi |
| 7,529,131 B2 | 5/2009 | Iwai et al. |
| 8,358,535 B2 | 1/2013 | Chae et al. |
| 8,395,936 B2 | 3/2013 | Li et al. |
| 8,804,446 B2 | 8/2014 | Okahiro |
| 8,891,325 B2 | 11/2014 | Choi et al. |
| 8,953,407 B2 | 2/2015 | Yun et al. |
| 9,111,633 B2 | 8/2015 | Kim |
| 9,373,378 B1 | 6/2016 | Chen |
| 9,412,447 B1 | 8/2016 | Bertin et al. |
| 9,418,711 B2 | 8/2016 | Ohgami |
| 9,552,866 B2 | 1/2017 | Mochida et al. |
| 9,653,131 B1 | 5/2017 | Yamanaka et al. |
| 9,824,746 B1 | 11/2017 | Lee |
| 9,922,726 B2 | 3/2018 | Choi |
| 10,008,256 B1 | 6/2018 | Kim |
| 10,014,063 B2 | 7/2018 | Tseng et al. |
| 10,347,321 B1 | 7/2019 | Yamanaka et al. |
| 10,490,256 B2 | 11/2019 | Jeong |
| 10,529,400 B1 | 1/2020 | Mahatme et al. |
| 10,553,297 B2 | 2/2020 | Sanasi et al. |
| 10,614,893 B2 | 4/2020 | Miyazaki |
| 10,636,469 B2 | 4/2020 | El-Mansouri et al. |
| 10,650,882 B2 | 5/2020 | Lin et al. |
| 10,665,271 B2 | 5/2020 | Takeda et al. |
| 10,672,443 B2 | 6/2020 | Gupta et al. |
| 10,685,709 B2 | 6/2020 | Tanaka et al. |
| 10,847,207 B2 | 11/2020 | Yamamoto et al. |
| 10,854,272 B1 | 12/2020 | Sato et al. |
| 10,854,273 B1 | 12/2020 | Sato |
| 10,854,274 B1 | 12/2020 | Grenzebach et al. |
| 10,910,027 B2 | 2/2021 | Suzuki |
| 10,910,075 B2 | 2/2021 | Yang et al. |
| 10,937,476 B2 | 3/2021 | Sato et al. |
| 2002/0001215 A1 | 1/2002 | Fujisawa et al. |
| 2002/0051377 A1 | 5/2002 | Choi et al. |
| 2002/0080677 A1 | 6/2002 | Watanabe et al. |
| 2003/0095438 A1 | 5/2003 | Hosogane |
| 2004/0004899 A1 | 1/2004 | Choi |
| 2004/0052146 A1 | 3/2004 | Sim |
| 2004/0156260 A1 | 8/2004 | Lee |
| 2004/0196719 A1 | 10/2004 | Aritomi et al. |
| 2005/0128858 A1 | 6/2005 | Lee et al. |
| 2005/0226086 A1 | 10/2005 | Sugawara |
| 2005/0254299 A1* | 11/2005 | Tanuma ............... G11C 16/08 365/185.11 |
| 2006/0158953 A1 | 7/2006 | Takahashi |
| 2006/0176758 A1 | 8/2006 | Chun |
| 2007/0008807 A1 | 1/2007 | Jeong |
| 2007/0030741 A1 | 2/2007 | Nii et al. |
| 2008/0031060 A1* | 2/2008 | Choi ............... G11C 11/4076 365/189.11 |
| 2008/0080229 A1 | 4/2008 | Cho |
| 2008/0123463 A1 | 5/2008 | Matsubara |
| 2009/0161418 A1 | 6/2009 | Yoon |
| 2010/0046313 A1 | 2/2010 | Lee et al. |
| 2010/0142306 A1 | 6/2010 | Nakamura et al. |
| 2010/0149900 A1 | 6/2010 | Kitayama |
| 2010/0157716 A1 | 6/2010 | Lee |
| 2011/0199837 A1 | 8/2011 | Reohr et al. |
| 2011/0228624 A1 | 9/2011 | Kim et al. |
| 2012/0081957 A1 | 4/2012 | Kim et al. |
| 2012/0120751 A1 | 5/2012 | Okahiro |
| 2012/0147686 A1 | 6/2012 | Takayama et al. |
| 2012/0257437 A1 | 10/2012 | Seko et al. |
| 2012/0287699 A1 | 11/2012 | Yun et al. |
| 2012/0327108 A1 | 12/2012 | Kato et al. |
| 2013/0135915 A1 | 5/2013 | Kim |
| 2013/0215697 A1 | 8/2013 | Choi et al. |
| 2013/0329495 A1 | 12/2013 | Shiino et al. |
| 2014/0369149 A1 | 12/2014 | Park |
| 2015/0098260 A1 | 4/2015 | Ohgami |
| 2015/0227738 A1 | 8/2015 | Katoh |
| 2015/0255146 A1 | 9/2015 | Mochida |
| 2015/0364174 A1 | 12/2015 | Ahn et al. |
| 2016/0095178 A1 | 3/2016 | Kuang et al. |
| 2016/0180948 A1 | 6/2016 | Tanabe |
| 2017/0075595 A1 | 3/2017 | Maejima |
| 2017/0103798 A1 | 4/2017 | Mochida |
| 2017/0178751 A1 | 6/2017 | Choi |
| 2017/0271021 A1 | 9/2017 | Futatsuyama et al. |
| 2017/0278579 A1 | 9/2017 | Lee et al. |
| 2018/0040362 A1 | 2/2018 | Kwak et al. |
| 2018/0074896 A1 | 3/2018 | Takada |
| 2018/0166119 A1 | 6/2018 | Jeong |
| 2018/0277182 A1 | 9/2018 | Inaba |
| 2019/0013055 A1 | 1/2019 | Ohgami |
| 2019/0035466 A1 | 1/2019 | Kim et al. |
| 2019/0088333 A1 | 3/2019 | Shirakawa et al. |
| 2019/0180812 A1 | 6/2019 | Sung et al. |
| 2019/0189186 A1 | 6/2019 | Won et al. |
| 2019/0214293 A1 | 7/2019 | Kim et al. |
| 2019/0325934 A1 | 10/2019 | Matsubara |
| 2019/0385649 A1 | 12/2019 | Kawamura |
| 2020/0027489 A1 | 1/2020 | Choi et al. |
| 2020/0075110 A1 | 3/2020 | Suzuki et al. |
| 2020/0105352 A1 | 4/2020 | Tanzawa |
| 2020/0111517 A1 | 4/2020 | Seo et al. |
| 2020/0143890 A1 | 5/2020 | Lee |
| 2020/0152249 A1 | 5/2020 | Kawamura |
| 2020/0185024 A1 | 6/2020 | Rehmeyer et al. |
| 2020/0294571 A1 | 9/2020 | Shin |
| 2020/0295021 A1 | 9/2020 | Maejima |
| 2020/0321045 A1 | 10/2020 | Yamamoto et al. |
| 2020/0327916 A1 | 10/2020 | Suzuki |
| 2020/0402557 A1 | 12/2020 | Sato et al. |
| 2020/0402565 A1 | 12/2020 | Sato et al. |
| 2020/0402566 A1 | 12/2020 | Sato |
| 2021/0012819 A1 | 1/2021 | Suzuki |
| 2021/0183422 A1 | 6/2021 | Sato et al. |

OTHER PUBLICATIONS

International Application No. PCT/US20/26423, titled "Apparatuses and Methods for Controlling Word Line Discharge", dated Apr. 2, 2020, pp. all.

U.S. Appl. No. 16/584,746 titled "Apparatuses and Methods for Dynamic Timing of Row Pull Down Operations" filed Sep. 26, 2019, pp. ail.

U.S. Appl. No. 16/378,524 titled "Apparatuses and Methods for Controlling Driving Signals in Semiconductor Devices" filed Apr. 8, 2019, pp. all.

U.S. Appl. No. 16/382,856 titled "Apparatuses and Methods for Controlling Word Line Discharge" filed Apr. 12, 2019, pp. all.

U.S. Appl. No. 16/450,696 titled "Apparatuses and Methods for Controlling Word Line Discharge" filed Jun. 24, 2019, pp. all.

U.S. Appl. No. 16/450,723 titled "Apparatuses and Methods for Controlling Word Line Discharge" filed Jun. 24, 2019, pp. all.

U.S. Appl. No. 16/450,737 titled "Apparatuses and Methods for Controlling Word Line Discharge" filed Jun. 24, 2019, pp. all.

* cited by examiner

APPARATUSES AND METHODS FOR PROVIDING MAIN WORD LINE SIGNAL WITH DYNAMIC WELL

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FXL) selected by a second portion of the row address.

Repeated access to a particular subword line, often referred to as a 'row hammer,' may cause an increased rate of data degradation in nearby subword lines. To reduce the effect of a row hammer event, a negative voltage lower than ground may be required for the MWL in order to discharge a subword line driver (SWD) at a certain voltage level, often referred to as a soft landing voltage (Voff) during the precharge, because the Voff is around 300 mV and the discharge at Voff needs be done via SWD PMOS transistors. The negative voltage in a semiconductor may adversely create a negative body to source voltage ($V_{bs}$), referred to as back bias. Back bias degrades the performance of the semiconductor as a result of the channel hot carrier (CHC) stress.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
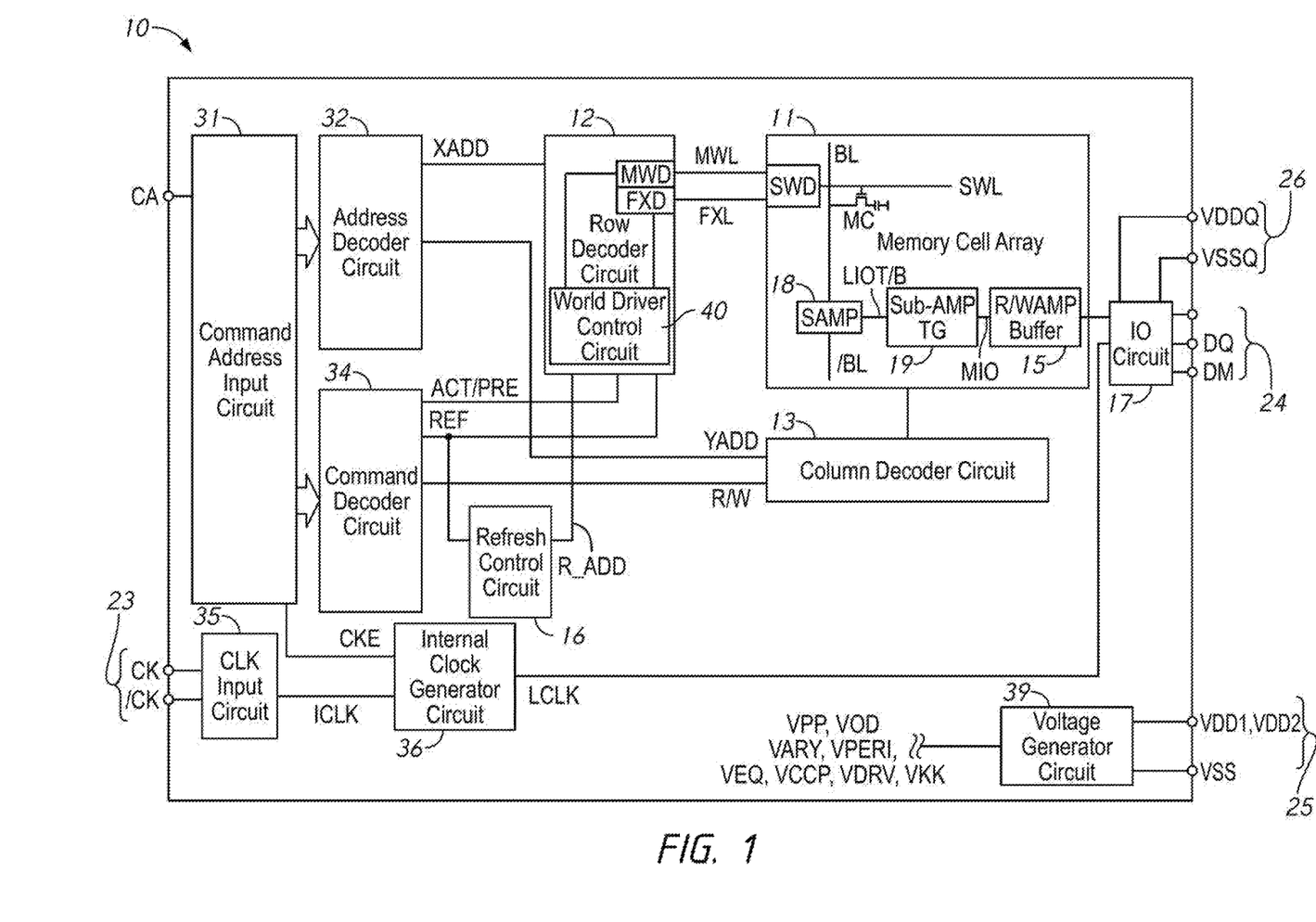
FIG. 1 is a diagram of a semiconductor device according to an embodiment of the disclosure.

FIG. 1 is a block diagram of a semiconductor device 10 according to an embodiment of the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells MC disposed at the intersections. The SWL may be driven by subword drivers SWD. For clarity, only one SWL, SWD, BL, and MC are shown in FIG. 1. A plurality of main word lines MWL and word driver lines FXL are coupled between a row decoder circuit 12 and the SWD. The selection of a main word line MWL and a word driver line FXL is carried out by the row decoder circuit 12. For example, the row decoder circuit 12 may control main word drivers (MWD) and word drivers (FXD) to select the main word lines MWL and word driver lines FXL. For clarity, only one MWD and FXD are shown. A semiconductor device may have multiple MWDs and FXDs. The selection of the bit line BL is carried out by a column decoder circuit 13. Sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches to read/write amplifiers and buffers 15.

Turning to the explanation of a plurality of external terminals included in the semiconductor device 10, the plurality of external terminals includes command and address terminals 21, clock terminals 23, data terminals 24, and power supply terminals 25 and 26. The command and address terminals 21 are supplied with command and address signals CA. The CA signals provided to the command and address terminals 21 include commands and addresses. Addresses included in the CA signals are transferred via a command/address input circuit 31 to an address decoder circuit 32. The address decoder circuit 32 receives the address signal ADD and supplies a decoded row address signal XADD to the row decoder circuit 12, and a decoded column address signal YADD to the column decoder circuit 13.

Commands included in the CA signals provided to the command and address terminals 21 are input to a command decoder circuit 34 via the command/address input circuit 31. The command decoder circuit 34 decodes the command signal COM to provide various internal command signals. For example, the command decoder circuit 34 may activate an activation signal ACT in response to an activation command and/or a refresh signal REF in response to a refresh command. For example, the internal commands may include a row command signal to select a word line and a column command signal, such as a read command or a write command, to select a bit line.

When a row activation command is issued and a row address is timely provided with the activation command, and a column address is timely provided with a read command, read data is read from a memory cell MC in the memory cell array 11 designated by these row address and column address. More specifically, the row decoder circuit 12 selects a main word line MWL, word driver line FXL, and subword line SWL indicated by the row address RA indicated by XADD so that the associated memory cell MC is subsequently coupled to the bit line BL. The read data DQ is output externally from the data terminals 24 via a read/write amplifier 15 and an input/output circuit 17. Similarly, when the row activation command is issued and a row address are timely provided with the activation command, and a column address is timely provided with a write command, the input/output circuit 17 may receive write data DQ at the data terminals 24. The write data DQ is provided via the input/output circuit 17 and the read/write amplifier 15 to the memory cell array 11 and written in the memory cell MC designated by the row address and the column address.

The row decoder circuit 12 may include a word driver control circuit 40 in some embodiments. The word driver control circuit 40 may receive an activation signal ACT from the command decoder circuit 34. In some embodiments, the word driver control circuit 40 may receive additional signals. The word driver control circuit 40 may provide control signals to one or more word drivers included in the row decoder circuit 12, such as the main word driver MWD and/or word driver FXD.

The device 10 may include a refresh control circuit 16 for carrying out refresh operations. The refresh operations may be an auto-refresh operation and/or other refresh operations. In some embodiments, a refresh command may be externally issued to the device 10 and provided to the command decoder circuit 34 which provides the command to the refresh control circuit 16 and row decoder circuit 12. In some embodiments, the refresh command may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation.

The clock terminals 23 are provided with external clock signals CK and /CK, respectively. These external clock signals CK and /CK are complementary to each other and are provided to a clock input circuit 35. The clock input circuit 35 receives the external clock signals CK and /CK and provides an internal clock signal ICLK. The internal clock signal ICLK is provided to an internal clock generator 36 and thus a phase controlled internal clock signal LCLK is provided based on the received internal clock signal ICLK and a clock enable signal CKE from the command/address input circuit 31. Although not limited thereto, a DLL circuit can be used as the internal clock generator 36. The phase controlled internal clock signal LCLK is provided to the input/output circuit 17 and is used as a timing signal for determining an output timing of the read data DQ.

The power supply terminals 25 are provided with power supply voltages VDD1, VDD2, and VSS. These power supply voltages VDD1, VDD2, and VSS are provided to an internal voltage generator circuit 39. The internal voltage generator circuit 39 provides various internal voltages VPP, VOD, VARY, VPERI, VEQ, VCCP, VDRV, VNRD, VNWL, and VOFF.

The internal potentials VCCP, VDRV, VNRD and are potentials which may be mainly used in the row decoder circuit 12 in some embodiments. VSS may also be used by row decoder circuit 12. For example, VSS may be used as a low potential and VCCP may be used as a high potential in some embodiments. VNRD may be a negative voltage in some embodiments. Although the detailed description thereof will be given later, the row decoder circuit 12 drives the main word line MWL and subword line SWL, selected based upon the address signal ADD, to a VCCP level corresponding to a high potential (e.g., 3.1 V) so that a cell transistor of the memory cell MC is turned on.

The internal potential VARY and VEQ is a potential to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are provided with power supply voltages VDDQ and VSSQ. These power supply voltages VDDQ and VSSQ are provided to the input/output circuit 17. The power supply voltages VDDQ and VSSQ may be the same voltages as the power supply voltages VDD2 and VSS that are provided to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
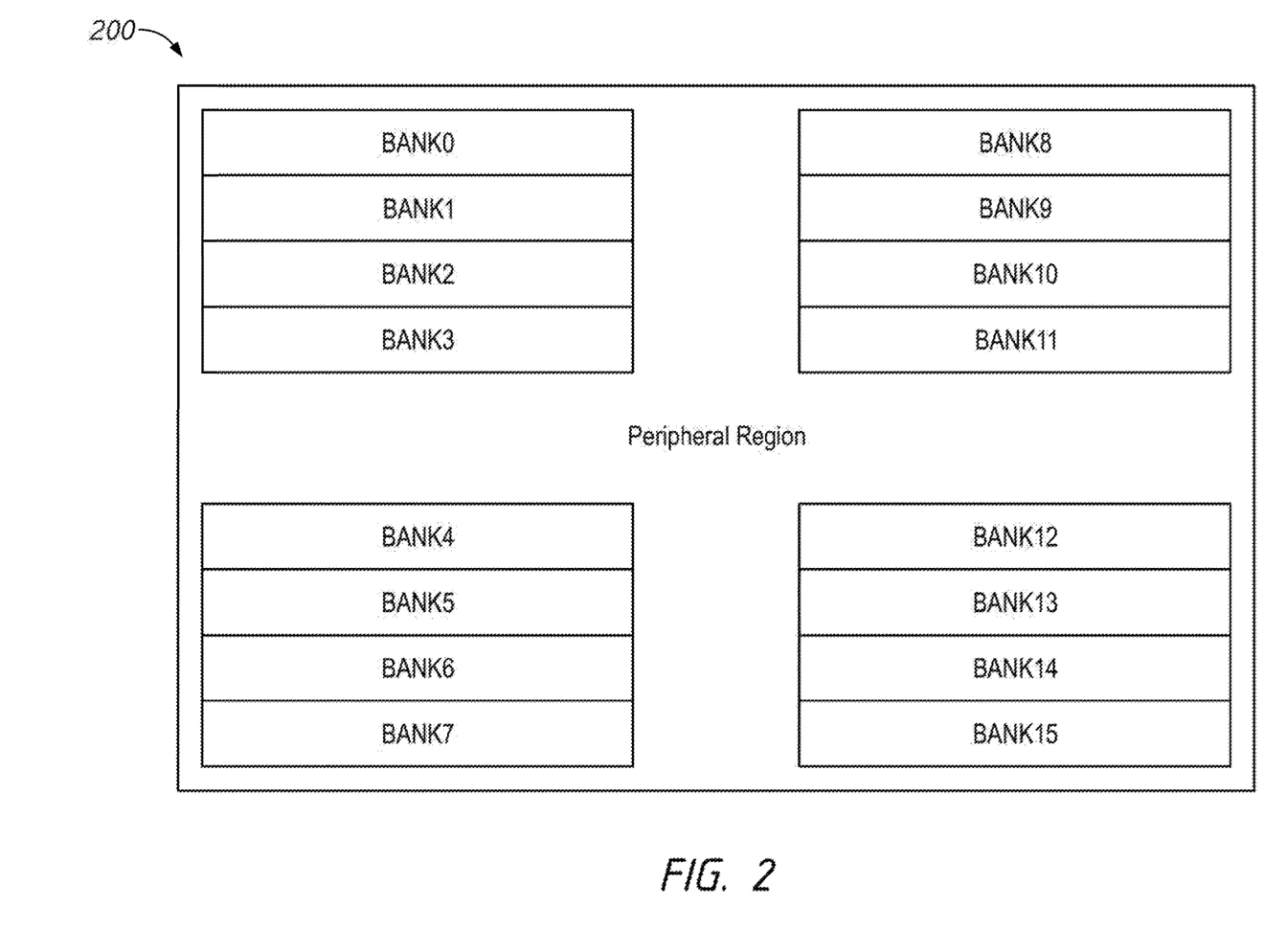
FIG. 2 is a diagram for an example layout of a memory cell array of a semiconductor device according to an embodiment of the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 shown in FIG. 1.

The memory cell array 200 of the example shown in FIG. 2 is divided into sixteen banks BK0 to BK15. A row decoder circuit (e.g., row decoder circuit 12 of FIG. 1; not shown in FIG. 2) may be disposed between adjacent banks and/or in the peripheral circuit region PE. In the peripheral circuit region PE, various peripheral circuits and external terminals may be disposed (not shown in FIG. 2).

Figure 3:
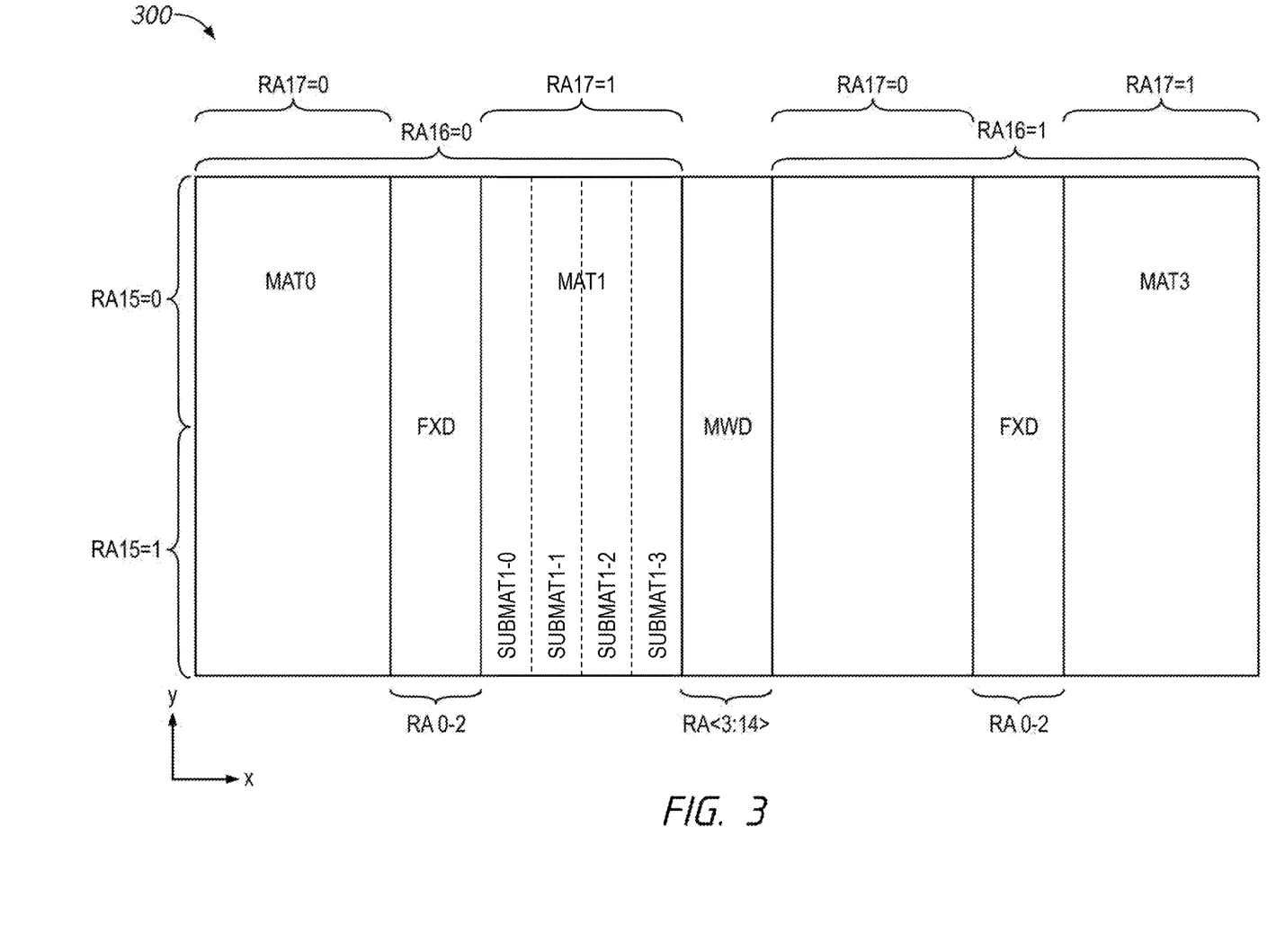
FIG. 3 is a diagram for an example configuration of a bank of a memory cell array according to an embodiment of the disclosure.

FIG. 3 is a diagram for an example configuration of a bank 300 of a memory cell array according to an embodiment of the disclosure. The banks BK0 to BK15 of FIG. 2 may each include the configuration of the bank 300 of FIG. 3 in some embodiments of the disclosure. In some embodiments, the bank 300 may be included in memory cell array 11 of the semiconductor device 10 shown in FIG. 1.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions, e.g., SUBMAT1-0-3. While the example shown in FIG. 3 includes four sub-regions, memory mat regions MAT0-3 may include more or fewer sub-regions in other examples. Each sub-region SUBMAT1-0-3 may include a plurality of memory mats (e.g., 32, 64, 128) aligned in the Y-direction. In some embodiments, the plurality of memory mats in a sub-region may be further sub-divided into sets. For example, SUBMAT1-0 may include 64 memory mats and the memory mats may be organized into eight sets of eight. For clarity, the individual memory mats are not shown in FIG. 3. The memory mats of each sub-region SUBMAT1-0-3 may be associated with a corresponding IO (e.g., DQ pad) in some embodiments.

With further reference to FIG. 3, the memory access to the memory mats may be controlled by a row decoder circuit, for example, the row decoder circuit 12 of FIG. 1. When a row address RA is input thereto, the row decoder selects a subword line by activating an appropriate main word driver (MWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWDs, each configured to activate a corresponding main word line (MWL). Continuing this example, each word driver FXD block may include eight word drivers FXDs, each configured to activate a corresponding word driver line (FXL).

In the example shown in FIG. 3, RA[0:15] are used to select one of the word lines through FXD and MWD decoding. For example, FXDs are determined by RA[0:2]; MWDs are determined by RA[3:14]; Mat0 and Mat 1, or Mat2 and Mat3 are determined by RA[16]; and a single mat of Mat0, Mat1, Mat2 or Mat3 is determined by RA[17]. However, other encoding schemes may be used.

Figure 4:
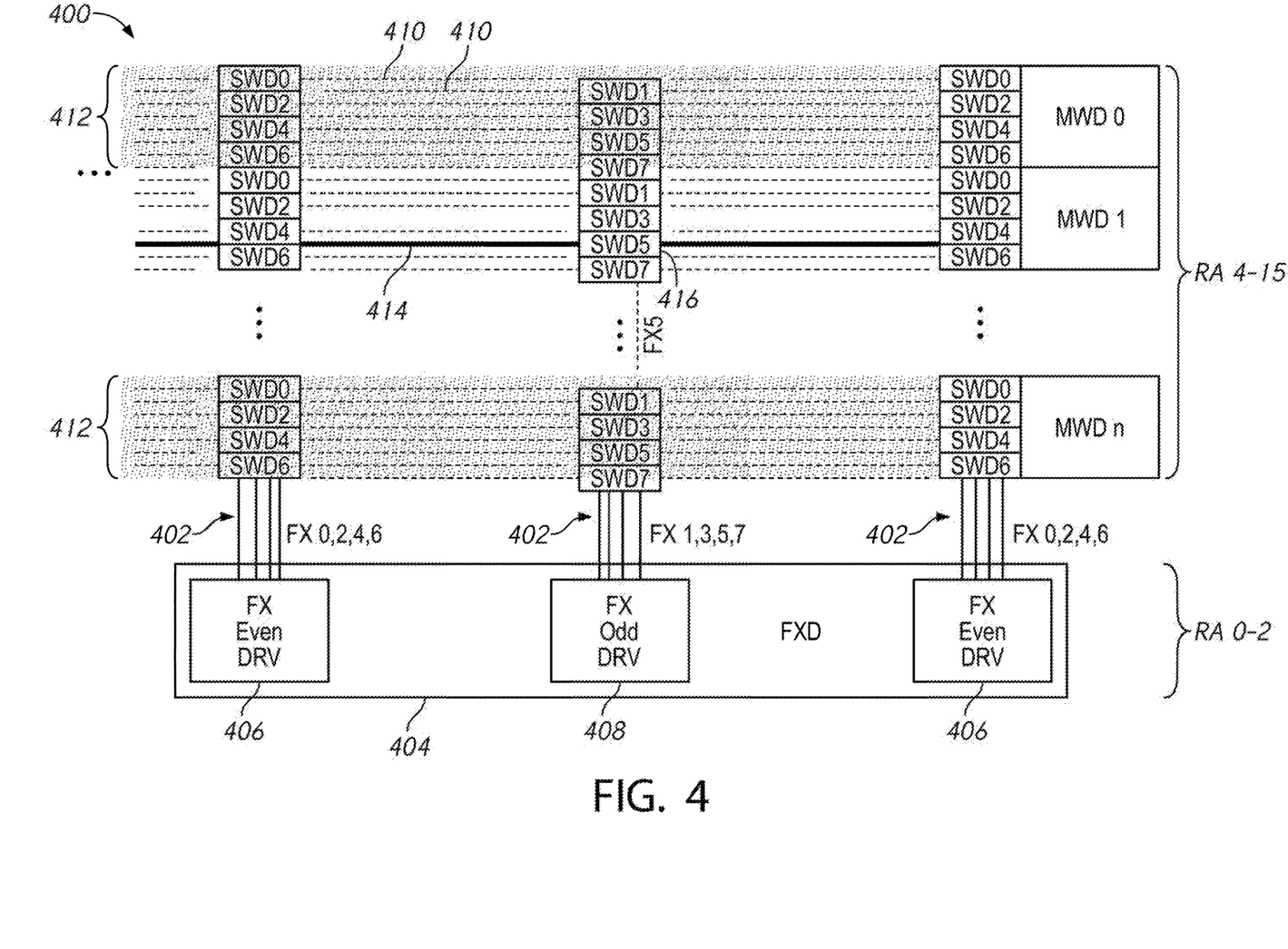
FIG. 4 is a diagram of a portion of a bank of a memory cell array according to an embodiment of the disclosure.

FIG. 4 is a diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and/or the memory cell array 11 of FIG. 1.

The subword lines are adjacent to each other, and driven by subword drivers SWD0-7 of different subword driver groups. Corresponding main word signals (not shown), driving signals FX, and low potential VSS (not shown) are provided to the subword drivers SWD0-7. In some embodiments, other potentials may be provided, such as a negative voltage VNRD. In some embodiments, the main word signals and the driving signals FX are signals that may be provided by main word drivers MWD0-N and word drivers FXD 404, respectively, included with the row decoder circuit, such as row decoder circuit 12 shown in FIG. 1, based upon the row address RA as described with reference to FIG. 3. The main word signal is provided to the subword drivers SWD0-7 over a main word line (not shown in FIG. 4), and the driving signals FX are provided to the subword drivers SWD0-7 over word driver lines 402.

A main word line MWL may extend over array regions of a respective memory mat (e.g., a memory mat in SUB-MAT1-0 in FIG. 3) to provide the main word signal to the subword driver groups of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0, SWD2, SWD4, and SWD6, of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FXL 5 may be coupled to the subword driver SWD5 of each memory mat.

In the example memory operation shown in FIG. 4, a row address RA has indicated MWD1 should be activated (e.g., selected) and odd word driver FXD 408 associated with word driver line FXL 5 should be activated (e.g., selected). As a result, a main word line MWL (not shown in FIG. 4) associated with MWD1 and driving signals (e.g., FXT and FXF) on the word driver line FXL 5 may be driven to active states for at least a portion of the duration of the memory operation (e.g., active period) to activate subword driver SWD5 416.

As shown by the shaded regions 412, subword lines 410 associated with the main word drivers MWD0, MWDn remain inactive, even the subword lines associated with word driver line FXL 5. However, the subword line 414 driven by subword driver SWD5 416 associated with activated MWD1 and FXL 5 is activated to allow access to memory cells along subword line 414. Thus, a selected subword line SWL of the selected memory mat associated with MWD1 is driven to the high potential by the corresponding activated subword driver SWD5. In some examples, the other subword drivers SWD of the selected memory mat drive the respective unselected subword lines SWL to the low potential to remain inactive. Subword drivers SWD of unselected memory mats (e.g., memory mats associated with MWD0 and MWDn) remain deactivated, and the subword lines SWL of the unselected memory mats MAT are not provided a voltage in some examples. That is, while a subword driver SWD may be enabled by an active main word driver MWD or an active word driver FXD, in order to be activated, a subword line SWL must be associated with a subword driver SWD coupled to an activated word driver FXD and an activated main word driver MWD. After the memory cells of the selected subword line SWL have been accessed, the selected subword line SWL is then discharged to the low potential by deactivating the MWD and/or FXD as described herein.

According to some embodiments of the disclosure, the subword line SWL is discharged in a controlled manner. For example, a voltage of the subword line SWL discharged may be controlled by driving the MWL to a negative voltage during a precharge state. This is further described with reference to FIG. 5.

Figure 5:
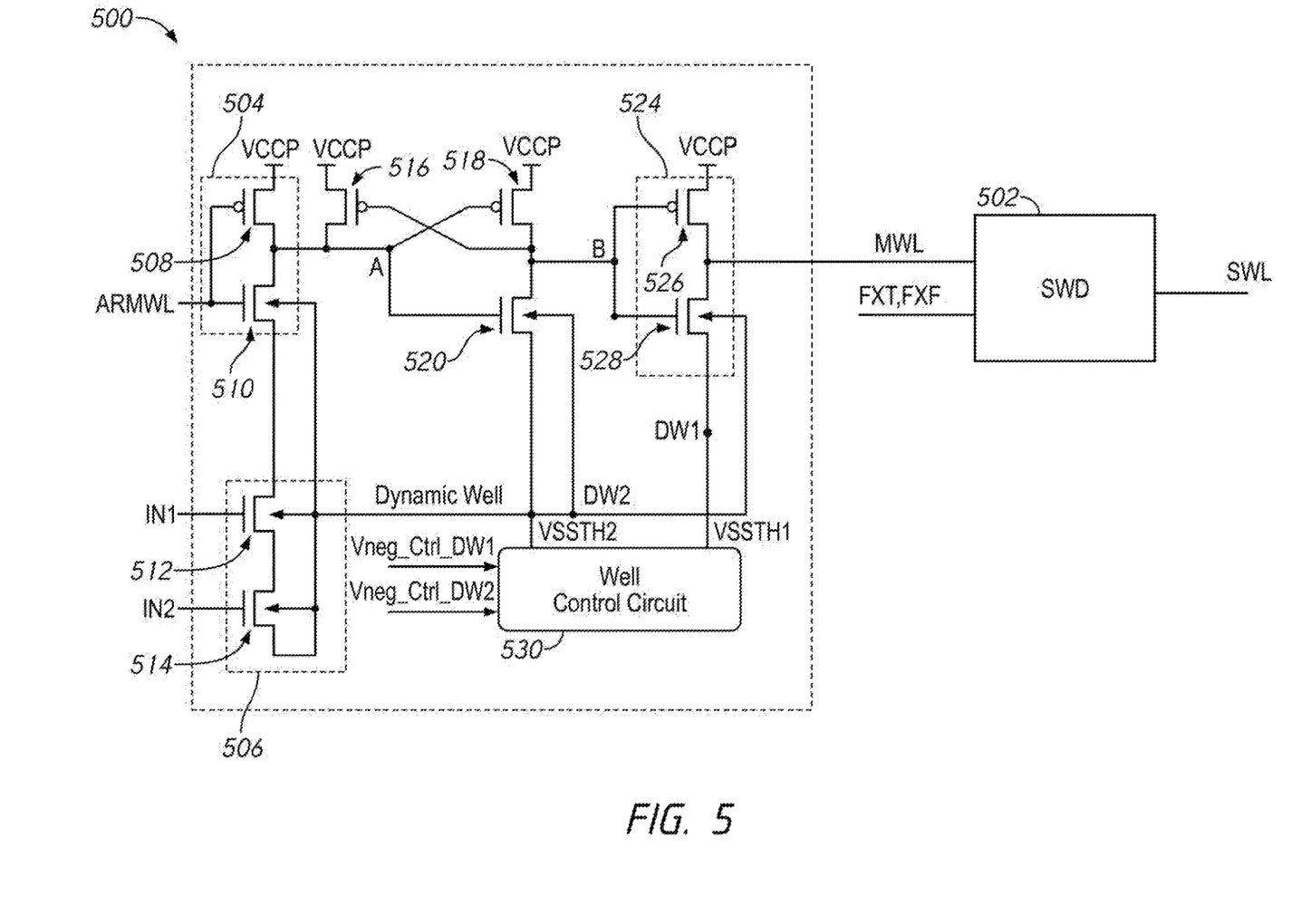
FIG. 5 is a diagram of a main word driver according to an embodiment of the disclosure.

FIG. 5 is a circuit diagram of a main word driver MWD 500 according to an embodiment of the disclosure. MWD 500 may be included in the main word drivers in FIG. 1, FIG. 3, and/or FIG. 4 in some embodiments. For context, a subword driver SWD 502 is also shown. SWD 502 may be included in subword drivers in FIGS. 1 and 4 in some embodiments. The SWD 502 may be coupled to the MWL of the MWD 500.

As shown in FIG. 5, the SWD 502 may be provided complementary driving signal FXT, FXF. The SWD 502 may also be provided with a low potential (e.g., VNML) or other potentials (e.g., ground, negative voltage). As previously described, the main word line MWL is provided by main word driver MWD 500 and the driving signals FXT and FXF are provided by a word driver (not shown in FIG. 5) on word driver lines FXL.

In some examples, the main word line MWL provides a low level when selected, and the driving signals FXT and FXF are signals that respectively become a high level and a low level when selected. When the main word line MWL and the driving signals FXT and FXF are activated (e.g., MWL and FXF are low and FXT is high), the corresponding subword line SWL may be activated. In contrast, when the main word line MWL is in the inactive state, and either of the driving signals FXT and FXF is also in the inactive state, the corresponding subword line SWL is inactive. The potential to which the subword line SWL is driven for active and inactive states may be based, at least in part, on a potential of the FXT and/or FXF signals and/or MWL. For example, when FXT is driven to VCCP and FXF is driven to VSS, subword line SWL may be driven to VCCP when activated by MWL.

Returning to the main word driver MWD 500, various signals may be provided to control the operation of the MWD 500. In the example shown in FIG. 5, MWD 500 may receive an active row main word line signal ARMWL, and one or more address signals (e.g., IN1, IN2). In some embodiments, these control signals may be provided by a word driver control circuit, such as word driver control circuit 40 shown in FIG. 1. In some embodiments, ARMWL and/or IN1, IN2 may be provided by an address decoder circuit, such as address decoder 32 in FIG. 1. In other embodiments, ARMWL and/or IN1, IN2 may be provided by address decoder logic in a row decoder circuit, such as row decoder circuit 12 shown in FIG. 1, based, at least in part, on an address signal (e.g., XADD) provided by the address decoder circuit.

The MWD 500 may include a main word line enable circuit 504, a main word line activation circuit 506 and a well control circuit 530. In some embodiments, the main word line enable circuit 504 may enable the main word line, for example, main word line enable circuit 504 may control whether or not the MWL can be driven to an active state. In some embodiments, the main word line enable circuit 504 include a pair of P-channel transistor and N-channel transistor (e.g., 508, 510) coupled in series via a common source/drain at a node (e.g., node A). The other source/drain of the P-channel transistor 508 may be coupled to a high potential (e.g., VCCP as shown in FIG. 5). The other source/drain of the N-transistor 510 may be coupled to the main word line activation circuit 506. In the example in FIG. 5, the main word line enable circuit 504 is coupled to the main word line activation circuit 506. The gates of the transistors 508, 510 may be coupled together to receive the ARMWL signal.

In some embodiments, a memory device may include multiple MWDs, although only one MWD 500 is shown in FIG. 5. In some embodiments of the disclosure, the MWD 500 may implement any of the multiple MWDs, such as the MWD0, MWD1, . . . and MWDn in FIG. 4. The ARMWL signal may be provided to the multiple MWDs to enable these MWDs. The memory device may select one of the MWDs through the control signals IN1, IN2. For example, the control signals IN1, IN2 may include address information provided by the address decoder, such as any combination of the RA3-9 (in FIG. 4), and configured to select one of the multiple MWDs. The main word line activation circuit 506 may receive the control signals IN1, IN2 and control when the MWL is selected to be driven to the active state. The active state may be provided by the word line enable circuit 504. Although only two signals IN1 and IN2 are shown, multiple address lines may be possible, depending on the number MWDs. The operation of the main word line activation circuit 506 is further explained.

In some embodiments, the main word line activation circuit 506 may include one or more N-channel transistors, e.g., 512, 514, serially coupled. The gates of the serially coupled N-channel transistors may be coupled to respective address lines. For example, the gates of transistors 512, 514 are respectively coupled to address lines, e.g., IN1, IN2. The source/drain of the transistors 512, 514 may be coupled together, and another source/drain of the transistor 514 may be coupled through node DW2 to the well control circuit 530, which will be described in detail with reference to FIG. 7.

In some embodiments, the main word line enable circuit 504 may be coupled to a pair of P-channel transistors 516 and 518 that are crossly coupled. For example, the gate of 516 may be coupled to a source/drain of the transistor 518 at note B, whereas the gate of transistor 518 may be coupled to a source/drain of the transistor 516 at node A, which is the output of the main word line enable circuit 504. The other source/drains of both transistors 516, 518 may be coupled to a high potential, e.g., VCCP. The pair of transistors 516, 518 may further be coupled to an N-channel transistor 520. For example, node A may be coupled to the gate of 520 and node B coupled to the source/drain of 520. The other source/drain of 520 may be coupled to the well control circuit 530 at node DW2.

The MWD 500 may further include an output circuit 524 comprising a pair of P-channel and N-channel transistors (e.g., 526, 528) coupled to node B. The source/drains of the transistors 526, 528 may be coupled at a common MWL line to provide a MWL signal to the SWD. The other source/drain of the P-channel transistor 526 may be coupled to the high potential VCCP, and the other source/drain of the N-channel transistor 528 may be coupled to the well control circuit at node DW1. The gates of the transistors 526, 528 may be coupled together at node B.

As explained in the present disclosure, a negative voltage, e.g., VNRD may be used to provide a negative voltage to the MWL line. The negative voltage on the MWL line may cause the SWD to discharge quicker than without providing the negative voltage. In some embodiments, the well of the transistor in the output circuit, e.g., transistor 528, may be biased to a fixed voltage value, such as a negative voltage. With the fixed negative voltage, e.g., VNRD, a negative body to source voltage $V_{bs}$ may be provided. In some examples, the VNRD may be at −0.7V, and used as the back bias. In this case, the voltage $V_{bs}$ for the transistor 528 may be −0.7V. Whereas a semiconductor with a negative back bias may have a degraded performance due to the CHC stress, in some examples, the source and body of a transistor may be provided the same potential. For example, the body of the transistor 528 may be connected to a dynamic well and biased through node DW2, and the source of the transistor 528 may be coupled to the well control circuit 530 at node DW1. An example of a dynamic well may include a well with changing conditions. For example, a dynamic well may be biased by a changing voltage instead of a fixed voltage. The well control circuit 530 may be configured to provide the same voltage to the nodes DW1 and DW2 such that the source and body of the transistor are provided the same potential, and $V_{bs}$ is zero. In some examples, the source and body of the transistor 520 may be connected through the dynamic well at node DW2. As such, the $V_{bs}$ of transistor 520 is zero. The zero voltage between the source and body of a transistor will result in improved performance of the transistor.

In some embodiments, the dynamic well also connects the well of other N-channel transistors, such as transistors 510, 512, 514. The dynamic well may be a P-well in the layout of the MWD 500. The well control circuit 530 may be configured to bias the dynamic well to provide a body voltage to the transistors in the dynamic well through node DW2. In some examples, the well control circuit 530 may be configured to provide a changing voltage to bias the dynamic well between 0v and −0.7V. For example, the voltage in the dynamic well may be biased at ground in an inactivated MWD. In an activated MWD, the voltage in the dynamic well may be biased from ground to an −0.7V pulse responsive to a precharge command. The operation of the MWD 500 is further explained.

In operation, if the memory row associated with the main word driver MWD 500 is selected, the control signals IN1, IN2 (e.g., addresses) will activate the main word line activation circuit 506. This will couple the drain/source of the N-channel transistor 514 to the potential at node DW2 provided by the well control circuit 530. When the ARMWL is low, the main word driver MWD may be deactivated, driving the MWL to an inactive state. This is explained with reference to the word enable circuit 504. Responsive to a low ARMWL signal, the transistor 508 may be activated and 510 may be deactivated. This causes node A to be coupled to a high potential VCCP through 508, regardless whether the main word line activation circuit 506 is activated. Further, when node A is at the high potential, transistor 518 is deactivated and transistor 520 is activated (with node DW2 at a low potential, e.g., VSS). This pulls down node B to the potential at node DW2, causing node B to be at a low potential. Consequently, the low potential at node B causes the transistor 526 to be activated and transistor 528 to be deactivated. Regardless of the potential at node DW1, the output at the MWL will be at logic high—an inactive state.

When the ARMWL is high, the main word driver MWD may be activated, driving the MWL to an active state. Responsive to the ARMWL being high, transistor 508 is deactivated and 510 is activated. The voltage at node A will be at least based on whether the main word line activation circuit 506 is activated. If the well control circuit 530 provides a low potential at node DW2, e.g., VSS (a low voltage, such as ground), the main word line activation circuit 506 may be activated, and the potential at node A is pulled down low through the transistors 510, 512 and 514. When node A is at the low potential, transistor 520 is deactivated, and transistor 518 is activated, causing node B to be coupled to the high potential, e.g., VCCP, through transistor 518. Thus, node B switches to the high potential. Consequently, transistor 526 is deactivated. If the potential at node DW1 is low, then transistor 528 is activated, pulling down the voltage at MWL to the low potential at DW1—an active state.

With further reference to FIG. 5, during the time when the MWD 500 is activated (responsive to a high ARMWL), an active ACT command (e.g., read, write command from the command decoder circuit 34 in FIG. 1) may be provided to the word driver control circuit 40 (in FIG. 1) followed by a precharge command PRE. The active ACT command may be provided for the memory cell associated with the activated MWD 500. Prior to the active ACT command, the word driver control circuit 40 may cause the well control circuit 530 to provide a low potential, e.g., VSS, at nodes DW1 and DW2. Responsive to the precharge command, the word driver control circuit 40 may cause the well control circuit 530 to switch the low potential to a deeper negative voltage, e.g., VNRD. For example, the potential at DW1 and DW2 may become VNRD (e.g., −0.7v). In response, the voltage at MWL will also be driven to the deeper negative voltage, e.g., VNRD. When provided to the SWD 502, the deeper negative voltage VNRD on the main word line MWL will control the rate of discharge for the SWD 502, which will result in a decrease of row hammer effect.

With further reference to FIG. 5, now the operation of unselected memory row is explained. If the memory row associated with the main word driver MWD 500 is unselected, the control signals IN1, IN2 (e.g., addresses) may deactivate the main word line activation circuit 506, in which at least one of the transistors 512 and 514 in the main word line activation circuit will be deactivated. When the main word driver MWD is deactivated, responsive to a low ARMWL signal, transistor 508 may be activated and 510 may be deactivated. Then, node A may be coupled to VCCP through 508, driving node A to a high potential, e.g., VCCP. Consequently, the transistor 518 will be deactivated, and the transistor 520 will be activated, causing node B to be coupled to node DW2. If node DW2 is provided a low potential, e.g., VSS by the well control circuit 530, node B will be at the low potential also. Consequently, the low potential at node B activates the transistor 516, causing node A to continue maintaining at high, even after the ARMWL signal becomes high. In other words, the voltage at node B will be at least based on the low potential at node DW2 provided by the well control circuit 530. When the low potential at DW2 is VSS (e.g., ground), the voltage at B will be at VSS. When the low potential at DW2 is a deeper negative voltage (e.g., VNRD), the voltage at B will be at the deeper negative voltage. Node A, on the other hand, will remain constant at potential high regardless whether or not the ARMWL is high, and independent of the variation in the low potential provided by the well control circuit 530.

With further reference to FIG. 5, when node B remains at low potential (responsive to the low potential at node DW2 provided by the well control circuit 530), transistor 526 is activated, which couples the MWL to the potential VCCP, driving the MWL to an inactive state since MWL is active low. The high potential at MWL will deactivate the SWD 502 to provide an inactive SWL signal to the memory row.

With further reference to FIG. 5, similar to the selected memory row, in the scenario of unselected memory row, during the time when the ARMWL is high, an active ACT command (e.g., read, write command from the command decoder circuit 34 in FIG. 1) may be provided to the word driver control circuit 40 (in FIG. 1) followed by a precharge command PRE. The active ACT command may be provided to a memory cell associated with other MWDs. Prior to the ACT command, the word driver control circuit 40 may cause the well control circuit 530 to provide a low potential, e.g., VSS. Responsive to a precharge command, the word driver control circuit 40 may cause the well control circuit 530 to switch the low potential to a deeper negative voltage, e.g., VNRD. For example, the potential at DW1 and DW2 may become VNRD (e.g., −0.7v). In response, the low potential at node B will vary with the potential at DW1, DW2, thus will also become a deeper negative voltage (e.g., −0.7v). As described above, because the potential at node B remains low, varying with DW1, DW2 provided by the well control circuit 530, transistor 526 remains activated, causing the output at MWL to be at constant high, e.g., VCCP, independent of the PRE command.

In some embodiments, the high potential VCCP in the MWD 500 may be provided by the voltage generator circuit (e.g., 39 in FIG. 1). The negative voltage VNRD provided to the well control circuit may also be generated from the voltage generator circuit (e.g., 39 in FIG. 1).

Figure 8:
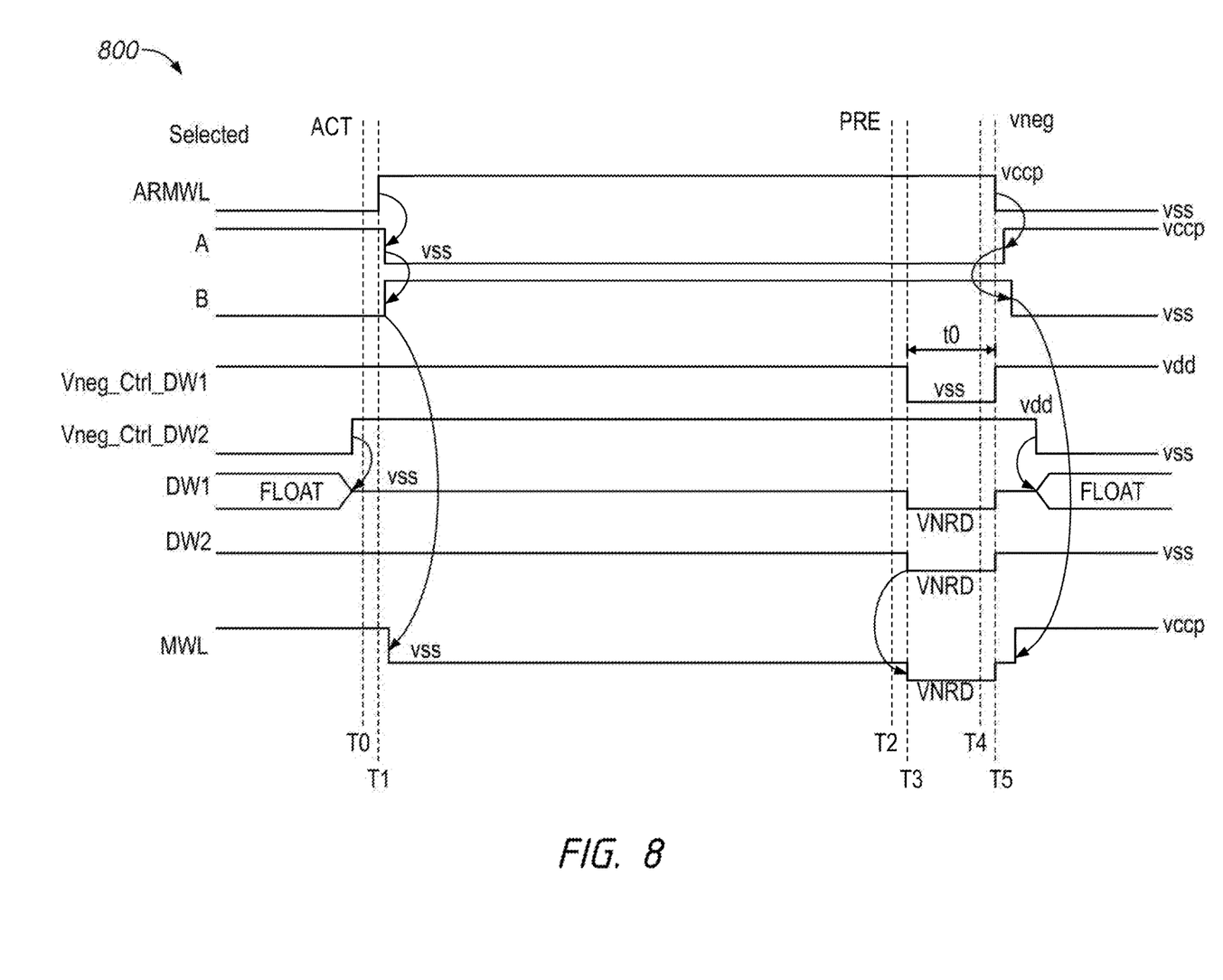
FIG. 8 is a timing diagram of various signals during operation of a selected driver circuit according to an embodiment of the disclosure.

FIG. 8 is a timing diagram 800 of various signals during the operation of a selected driver circuit according to an embodiment of the disclosure. In some embodiments, timing diagram 800 may show the operation of a driver circuit during a memory access operation (e.g., activation). In some embodiments of the disclosure, the driver circuit of FIG. 5 may be operated according to the example operation of timing diagram 800. The timing diagram 800 will be described with reference to the driver circuit of FIG. 5. However, the example of FIG. 8 is not limited to the specific embodiment of the MWD 500.

At some time before T0, an activation command is received by a memory device that includes the word driver. In response, an internal activation signal ACT may transition to an active state. The internal activation signal ACT may be received by a word driver control circuit, such as word driver control circuit 40 shown in FIG. 1. An address signal may be provided to the memory device with the ACT signal to select a MWL and SWL for activation.

At or around T1, responsive to the active ACT command, the ARMWL signal may be active (e.g., a high potential). The potentials at nodes DW1 and DW2 provided by the well control circuit (e.g., 530 in FIG. 5) may be at a low potential, e.g., VSS. As described with reference to FIG. 5, the active ARMWL signal may cause the potential at node A to become low, which also causes the potential at node B to become high. This causes the MWL to be at an active state (e.g., a low potential).

Sometime before T2, a precharge command may be received by the memory device. In response, an internal precharge signal PRE may transition to an active state. Responsive, at least in part to the active precharge signal PRE, at or around T3, the command decoder circuit (e.g., 34 in FIG. 1) may activate a control signal Vneg_Ctrl_DW1 (e.g., at an active low) for a duration of time (e.g., t0). The active Vneg_Ctrl_DW1 signal may control the well control circuit (e.g., 530 in FIG. 5) to provide a deeper negative potential (e.g., VNRD) to the MWD 500 at nodes DW1, DW2. This may couple the MWL to the deeper negative potential via transistor 528. Thus, MWL may be driven to a negative voltage VNRD (e.g. approximately −0.7 volts in the example shown) to be provided to the SWD (e.g., 502 in FIG. 5).

At or around T5, ARMWL is driven to an inactive state (e.g., a low potential in the example shown in FIG. 8). As a result, as disclosed previously with reference to FIG. 5, the potentials at nodes A and B are driven to a high potential and low potential, respectively. Subsequently, the potential of MWL is driven to a high potential at VCCP—an inactive state. In some examples, before the potential of MWL is driven to the high potential, e.g., VCCP, the duration of time t0 in the signal Vneg_Ctrl_DW1 may have expired, which drives the potential of nodes DW1 and DW2 to VSS. Consequently, the potential of MWL may be at VSS.

In summary, for a selected word line main driver (e.g., 500 in FIG. 5), the MWL may be driven to a first low potential (e.g., VSS) during a memory activation sequence (e.g., responsive to an activation command ACT). Responsive to a precharge command, MWL may be driven to a second low potential (e.g., VNRD), which may be lower than the first low potential. In some embodiments, the second low potential may be a negative voltage. After the activation sequence, MWL may be returned to a high potential (e.g., an inactive state).

Figure 9:
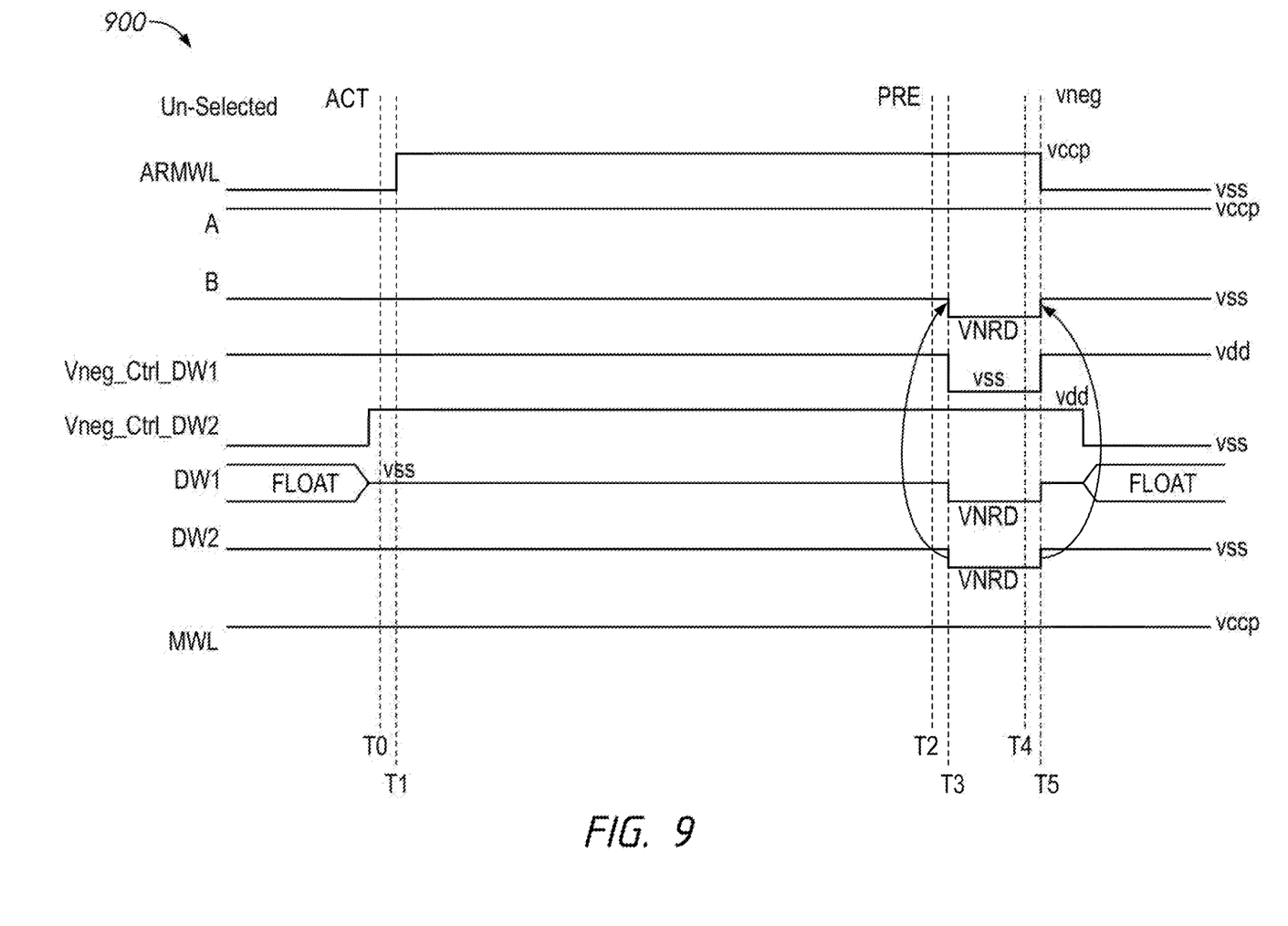
FIG. 9 is a timing diagram of various signals during operation of an unselected driver circuit according to an embodiment of the disclosure.

FIG. 9 is a timing diagram of various signals during the operation of an unselected driver circuit according to an embodiment of the disclosure. In some embodiments, timing diagram 900 may show the operation of a driver circuit during a memory access operation (e.g., activation). In some embodiments of the disclosure, the driver circuit of FIG. 5 may be operated according to the example operation of timing diagram 900. The timing diagram 900 will be described with reference to the driver circuit of FIG. 5. However, the example of FIG. 9 is not limited to the specific embodiment of the MWD 500.

At some time before T0, an activation command is received by a memory device that includes the word driver. In response, an internal activation signal ACT may transition to an active state. The internal activation signal ACT may be received by a word driver control circuit, such as word driver control circuit 40 shown in FIG. 1. An address signal may be provided to the memory device with the ACT signal to select a MWL and SWL for activation.

At or around T1, responsive to the active ACT command, the ARMWL signal may be active (e.g., a high potential). The potentials at nodes DW1 and DW2 provided by the well control circuit (e.g., 530 in FIG. 5) may be at VSS. As described with reference to FIG. 5, because of the transistors 516, 518, the potential at node A remains constant at a high potential regardless of the potential of the ARMWL signal. Subsequently, node B is coupled to the low potential of the well control circuit (e.g., 530 in FIG. 5), causing transistor 526 to couple the MWL to the high potential e.g., VCCP. In the example shown, the low potential at node B is VSS.

Sometime before T2, a precharge command may be received by the memory device. In response, an internal precharge signal PRE may transition to an active state. Responsive, at least in part to the precharge signal PRE, at or around 13, the command decoder circuit (e.g., 34 in FIG. 1) may activate a control signal Vneg_Ctrl_DW1 (e.g., at an active low) for a duration of time (e.g., t0). The active Vneg_Ctrl_DW1 signal may control the well control circuit (e.g., 530 in FIG. 5) to provide a deeper negative potential (e.g., VNRD) to the MWD 500 at nodes DW1, DW2. This may couple node B to the deeper negative potential via transistor 520. The MWL may stay at high potential (e.g., VCCP) because of the active transistor 526. Thus, an inactive high MWL is provided to the SWD (e.g., 502 in FIG. 5).

At or around T5, ARMWL is driven to an inactive state (e.g., a low potential in the example shown in FIG. 9). As a result, as disclosed previously with reference to FIG. 5, the potential of MWL is maintained at high at VCCP. In summary, for an unselected main word line driver, the MWL may stay inactive (e.g., at high potential) all time.

Figure 6:
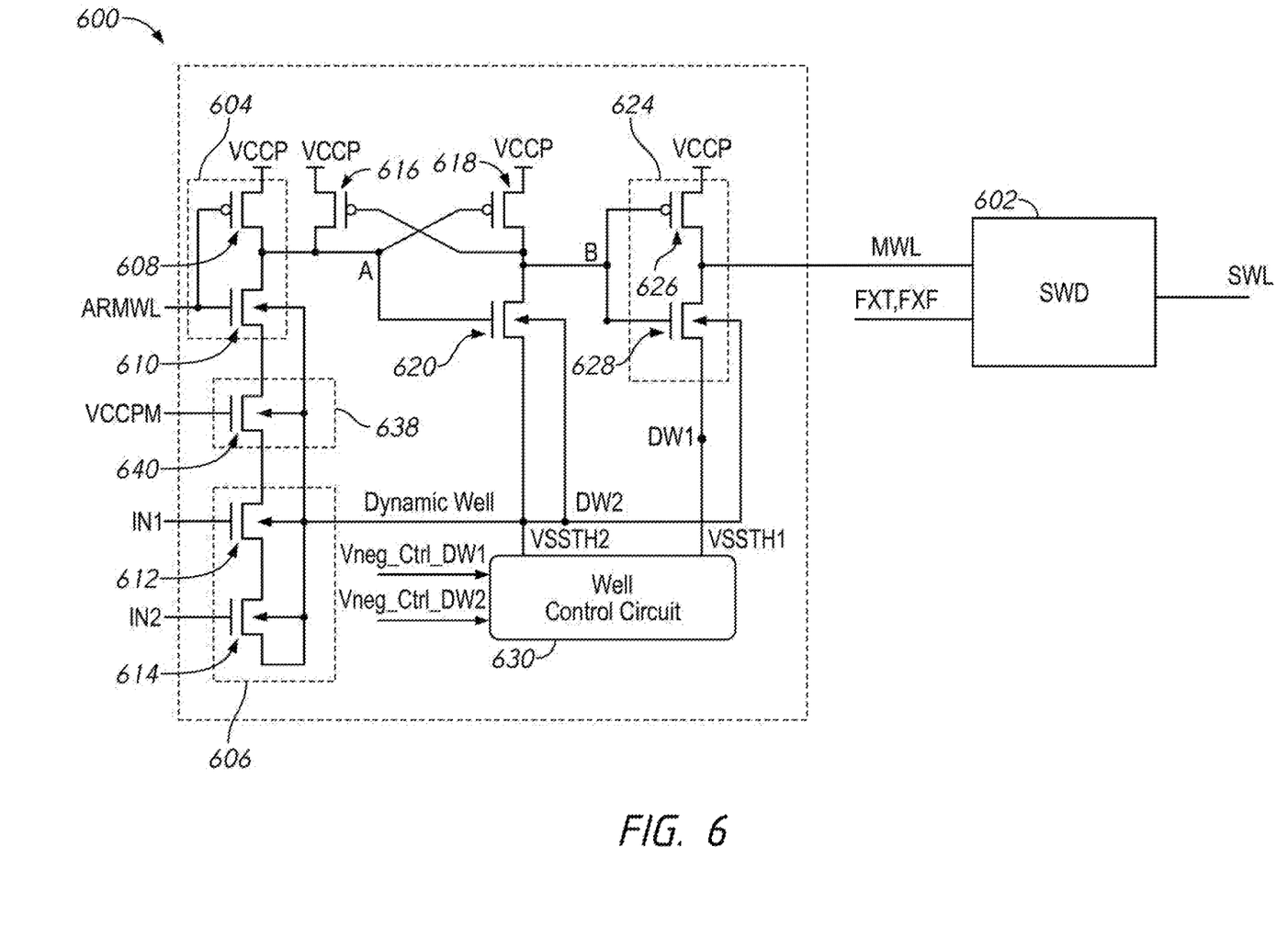
FIG. 6 is a diagram of a main word driver according to an embodiment of the disclosure.

FIG. 6 is a diagram of a main word driver 600 according to an embodiment of the disclosure. MWD 600 may be included in the main word drivers in FIG. 1, FIG. 3, and/or FIG. 4 in some embodiments. For context, a subword driver SWD 602 is also shown. SWD 602 may be included in subword drivers in FIGS. 1 and 4 in some embodiments. The SWD 602 may be coupled to the MWL provided by the MWD 600. The MWD 600 is similar to the MWD 500 (in FIG. 5). The SWD 602 is also similar to SWD 502. Reference numerals in the 600's in FIG. 6 may represent the same components with reference numerals in the corresponding 500's in FIG. 5. Thus, the descriptions of various components in FIG. 6 are not repeated. The difference from the MWD 500 (in FIG. 5) is that the MWD 600 includes a protection circuit 638 coupled between the main word line enable circuit 604 and the main word line activation circuit 606. The protection circuit 638 may include an N-channel transistor 640 and configured to protect the main word line activation circuit 506. For example, the gate of the transistor 640 may be coupled to a fixed voltage VCCPM. In some example, the VCCPM may be 1.8V. In some examples, the transistor 640 may have a threshold voltage of 0.6V. Then, the potential at the source/drain of the transistor 640 that is coupled to the source/drain of the transistor 612 may be 1.8−0.6=1.2V, effectively protecting the main word line activation circuit 606. In some embodiments, the well of the N-channel transistor 640 is also connected to the dynamic well and controlled by the well control circuit 630.

In some examples, the MWD 600 may be operated in a similar manner as the MWD 500 (in FIG. 5), and may be configured to generate the same signals as MWD 500 (shown in FIGS. 8 and 9). As such, the operation of MWD 600 and the timing of the various signals of MWD 600 are not repeated.

Figure 7:
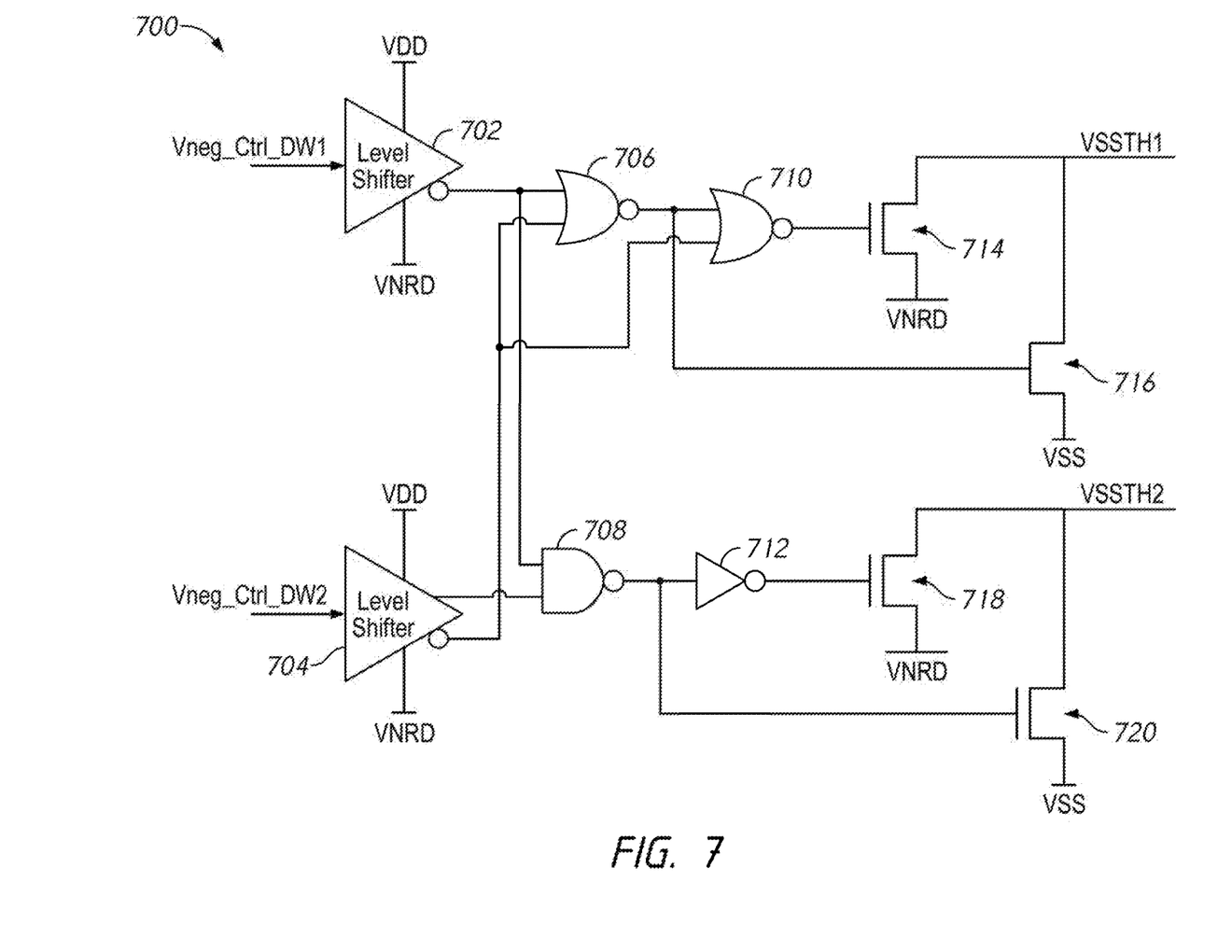
FIG. 7 is a diagram of a well control circuit according to an embodiment of the disclosure.

FIG. 7 is a diagram of a well control circuit according to an embodiment of the disclosure. In some examples, well control circuit 700 may include a first level shifter 702 configured to receive a control signal Vneg_Ctrl_DW1 at an input node and a second level shifter 704 configured to receive a control signal Vneg_Ctrl_DW2 at an input node. The control signals Vneg_Ctrl_DW1 and Vneg_Ctrl_DW2 may be provided from the command decoder circuit (e.g., 34 in FIG. 1). An example timing of the Vneg_Ctrl_DW1 and Vneg_Ctrl_DW2 control signals is shown in FIGS. 8 and 9. Each of the level shifters 702, 704 may have an inverting output and a non-inverting output. The output (including inverting output and/or non-inverting output) from the level shifters 702, 704 may be combined through logic gates 706, 710 to drive transistors 714, 716. In some examples, gates 706 and 710 may each be an NOR gate. The source/drain of the transistor 714 and the source/drain of the transistor 716 may be commonly coupled at output VSSTH1. The other source/drain of the transistors 714, 716 may be respectively coupled to the negative voltage VNRD and the ground VSS. The output (including inverting output and/or non-inverting output) from the level shifters 702, 704 may also be combined through logic gates 708, 712 to drive transistors 718, 720. In some examples, gate 708 may be a NAND gate. Gate 712 may be an inverter. The source/drain of the transistor 718 and the source/drain of the transistor 720 may be commonly coupled at output VSSTH2. The other source/drain of the transistors 718, 720 may be respectively coupled to the negative voltage VNRD and the ground VSS. As shown in FIGS. 5 and 6, the output voltages VSSTH1, VSSTH2 of the well control circuit 530, 630 may be coupled to the nodes DW1, DW2, respectively.

With further reference to FIG. 7 and FIG. 8, the operation of the well control circuit 700 is explained in detail. The control signal Vneg_Ctrl_DW1 may be provided at a logic high. In response to a PRE command, for example, at or around T3, the Vneg_Ctrl_DW1 may become active (e.g., at a logic low) for a duration of time t0. The control Vneg_Ctrl_DW2 may be active at a logic high when the ARMWL signal is active.

When the ARMWL signal is inactive (e.g., before time T0 or after time T5, during which the memory cell may be at a precharge state), the control signals Vneg_Ctrl_DW1 and Vneg_Ctrl_DW2 may be provided respectively at a logic high and a logic low state. Consequently, the inverting output node of the level shifter 702, 704 may be respectively at a logic low and logic high. This causes the output of the NOR gate 706 and the output of the NOR gate 710 to be both at logic low. In response, both the transistor 714 (e.g., an NMOS transistor) and 716 (e.g., an NMOS transistor) may be turned off. Consequently, the output voltage VSSTH1 (at node DW1, FIGS. 5 and 6) may be floating. Further, the output of the NAND gate 708 and the output of the inverter 712 may be at a logic high and a logic low, respectively. In response, the transistor 718 (e.g., an NMOS transistor) may be turned off, and the transistor 720 (e.g., an NMOS transistor) may be turned on to pull down the output voltage VSSTH2 (at node DW2, FIGS. 5 and 6) to a low potential, e.g., VSS.

At some time before T0, the Vneg_Ctrl_DW2 may become active, e.g., at a logic high, while the Vneg_Ctrl_DW1 stays at the high potential. Consequently, the inverting output node of the level shifter 702, 704 may be both at a logic low. This causes the output of the NOR gate 706 to be at logic high and the output of the NOR gate 710 to be at logic low. In response, the transistor 714 (e.g., an NMOS transistor) may be turned off and 716 (e.g., an NMOS transistor) may be turned on to pull down the output voltage VSSTH1 (at node DW1, FIGS. 5 and 6) to a low potential, e.g., VSS. Further, the output of the NAND gate 708 and the output of the inverter 712 may be at a logic high and a logic low, respectively. In response, the transistor 718 (e.g., an NMOS transistor) may be turned off, and the transistor 720 (e.g., an NMOS transistor) may be turned on to pull down the output voltage VSSTH2 (at node DW2, FIGS. 5 and 6) to a low potential, e.g., VSS.

At some time after T5, the Vneg_Ctrl_DW2 may become inactive, e.g., at a logic low, while the Vneg_Ctrl_DW1 is at the high potential. Consequently, similar to the voltages before T0, the output voltage VSSTH1 (a node DW1, FIGS. 5 and 6) may be floating again, and the output voltage VSSTH2 (at node DW2, FIGS. 5 and 6) may be at a low potential, e.g., VSS.

While the ARMWL signal is active, in responsive to a PRE command at or around T3, the control signal Vneg_Ctrl_DW1 may be at an active low for a duration of time, e.g., t0. The control signal Vneg_Ctrl_DW2 may stay at the logic high. Consequently, the inverting output node of the level shifter 702, 704 may be respectively at a logic high and logic low. This causes the output of the NOR gate 706 to be at logic low and the output of the NOR gate 710 to be at logic high. In response, the transistor 716 (e.g., an NMOS transistor) may be turned off, and 714 (e.g., an NMOS transistor) may be turned on to pull down the output voltage VSSTH1 (at node DW1, FIGS. 5 and 6) to a deeper negative voltage, e.g., VNRD. Further, the output of the NAND gate 708 and the output of the inverter 712 may be at a logic low and a logic high, respectively. In response, the transistor 720 (e.g., an NMOS transistor) may be turned off, and the transistor 718 (e.g., an NMOS transistor) may be turned on to pull down the output voltage VSSTH2 (at node DW2, FIGS. 5 and 6) to a negative voltage, e.g., VNRD.

When the MWD (e.g., 500 in FIG. 5) is unselected, the operation of the well control circuit 700 may operate in a similar manner. As such, as shown in FIG. 9, the timing for the control signals Vneg_Ctrl_DW1/Vneg_Ctrl_DW2, and the output voltages VSSTH1/VSSTH2 (at DW1/DW2) may be the same as that in FIG. 8. Similarly, the well control circuit 700 may also operate in a similar manner in the MWD 600 (FIG. 6). The timing chart for the MWD 600 may be identical to that of the MWD 500, as shown in FIGS. 8 and 9.

As explained with reference to FIGS. 7-9, the well control circuit 700 provides different states for the output voltages VSSTH1 at node DW1 (e.g., floating) and VSSTH2 at node DW2 (e.g., low potential VSS) when the ARML signal is inactive. When the output VSSTH1 (at DW1 in FIG. 5) is floating, both transistors 714 and 716 are turned off, effectively preventing a current leak from transistor 528 (in FIG. 5) when the transistor 528 is turned off.

As described in the present disclosure, with reference to FIGS. 5-9, the main word driver MWD 500 and 600 operate to provide a negative voltage in the MWL signal e.g., VNRD, which is a deeper negative voltage than the low potential, e.g., VSS. When MWL signal is provided to the subword driver SWD, the deeper negative voltage causes the SWD to discharge quickly in the precharge time. The configuration of MWD 500, 600 provides advantages in that the wells of the N-channel transistors are connected, as well as the sources of the N-channel transistors in the output circuit of the MWD, to the dynamic well. The voltage in the dynamic well is controlled by a well control circuit to change between 0 and −0.7V to provide the needed negative voltage. This configuration effectively reduces the $V_{bs}$ of the transistors, thus improve the performance of the transistors.

Furthermore, a current leak of the transistors in the output circuit, e.g., 528, 628, is prevented. This eliminates the need of a power shot protection circuit that would be required at node B, which reduces the layout space as would be required in a circuit without connecting the wells of the N-channel transistors as shown in FIGS. 5 and 6.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a well;
   a main word driver configured to drive a main word line, wherein the main word driver comprises at least a first transistor, wherein a body and a source/drain of the first transistor are coupled to the well; and
   a well control circuit coupled to the well and configured to bias the well, wherein the well control circuit is configured to bias the well to a first potential followed by a second potential responsive to a precharge command, wherein the second potential is lower than the first potential.

2. The apparatus of claim 1, wherein the first potential is ground and the second potential is a negative voltage.

3. The apparatus of claim 1 further comprising a second transistor, wherein a body of the second transistor is coupled to the well and a source/drain of the second transistor is coupled to the well control circuit.

4. The apparatus of claim 3, wherein the well control circuit is further configured to provide the second potential to the source/drain of the second transistor responsive to the precharge command.

5. The apparatus of claim 4, wherein the well control circuit is configured to receive a first control signal and a second control signal to provide the first potential and the second potential, wherein:
   the first control signal is active responsive to the precharge command; and
   the second control signal is active responsive to an active row main word line signal.

6. The apparatus of claim 3 further comprising additional transistors having bodies thereof coupled to the well.

7. The apparatus of claim 3, wherein the second transistor is coupled to the main word line and configured to provide the first potential at the main word line responsive to an active ACT command and the second potential at the main word line responsive to the precharge command.

8. A method comprising:
   providing, at a well control circuit, a voltage to bias a well in a main word driver to provide a main word line signal to a subword driver coupled to the main word driver, wherein the main word driver comprises at least a first transistor, wherein a body and a source/drain of the first transistor are coupled to the well, wherein biasing the well comprises biasing the well to a first potential followed by a second potential responsive to a precharge command, wherein the second potential is lower than the first potential.

9. The method of claim 8 further comprising providing the second potential to a source/drain of a second transistor responsive to the precharge command, wherein a body of the second transistor is coupled to the well.

10. The method of claim 9, wherein biasing the well to the first potential is based at least on a row main word line signal becoming active and biasing the second potential is based at least on the precharge command.

11. The method of claim 9 further comprising biasing bodies of additional transistors, wherein the bodies of the additional transistors are coupled to the well.

12. The method of claim 10 further comprising, at the well control circuit:
   providing the first potential and the second potential based at least on a first and second control signals, wherein:
   the first control signal is active responsive to the precharge command; and
   the second control signal is active responsive to an active row main word line signal.

13. The method of claim 9 further comprising providing the first potential at the main word line responsive to an active activation command and the second potential at the main word line responsive to the precharge command, wherein the second transistor is coupled to the main word line.

14. An apparatus comprising:
   a subword driver configured to drive a subword line; and
   a main word driver configured to drive a main word line coupled to the subword driver, wherein the main word driver is configured to drive the main word line to a first potential and to a second potential lower than the first potential, wherein the main word line is configured to select the subword driver at the first potential and the second potential,
   wherein the main word driver comprises at least:
   a first transistor coupled to the main word line to provide the first potential and the second potential to the main word line, and
   a second transistor coupled to the first transistor to drive the first transistor, wherein a body and a source/drain of the second transistor are coupled to a well;
   a well control circuit coupled to the well and the first transistor, the well control circuit configured to bias the well and provide the first potential and the second potential to the first transistor, wherein the well control circuit is configured to bias the well to the first potential, and further configured to bias the well to the second potential responsive to a precharge command.

15. The apparatus of claim 14, wherein a body of the first transistor is coupled to the well and a source/drain of the first transistor is coupled to the well control circuit.

16. An apparatus comprising:
   a subword driver configured to drive a subword line; and
   a main word driver configured to drive a main word line coupled to the subword driver, wherein the main word driver is configured to drive the main word line to a first potential and to a second potential lower than the first potential, wherein the main word line is configured to select the subword driver at the first potential and the second potential,
   wherein the main word driver comprises at least:
   a first transistor coupled to the main word line to provide the first potential and the second potential to the main word line, and a second transistor coupled to the first transistor to drive the first transistor, wherein a body and a source/drain of the second transistor are coupled to a well, wherein the first transistor is configured to provide the first potential at the main word line responsive to an active activation command and to provide the second potential at the main word line responsive to a precharge command.

\* \* \* \* \*